United States Patent
Kobayashi et al.

(10) Patent No.: US 8,964,059 B2
(45) Date of Patent: Feb. 24, 2015

(54) SCANNING CIRCUIT, SOLID-STATE IMAGE SENSOR, AND CAMERA

(71) Applicant: Canon Kabushiki Kaisha, Tokyo (JP)

(72) Inventors: Hideo Kobayashi, Tokyo (JP); Masanori Ogura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 13/957,033

(22) Filed: Aug. 1, 2013

(65) Prior Publication Data
US 2014/0078335 A1  Mar. 20, 2014

(30) Foreign Application Priority Data

Sep. 14, 2012  (JP) ................................. 2012-203536

(51) Int. Cl.
| | | |
|---|---|---|
| H04N 5/235 | (2006.01) | |
| H04N 5/335 | (2011.01) | |
| G11C 19/00 | (2006.01) | |
| H01L 27/00 | (2006.01) | |
| H04N 5/378 | (2011.01) | |
| G11C 19/28 | (2006.01) | |
| H04N 5/376 | (2011.01) | |

(52) U.S. Cl.
CPC ................ *G11C 19/00* (2013.01); *H04N 5/378* (2013.01); *G11C 19/28* (2013.01); *H04N 5/376* (2013.01)
USPC ........ 348/222.1; 348/308; 377/54; 250/208.1

(58) Field of Classification Search
USPC ................. 348/222.1, 3.8; 377/54; 250/208.1
See application file for complete search history.

(56) References Cited

U.S. PATENT DOCUMENTS

| | | | |
|---|---|---|---|
| 6,956,605 B1 * | 10/2005 | Hashimoto | .................... 348/301 |
| 2013/0107096 A1 | 5/2013 | Ogura et al. | .................. 348/308 |

FOREIGN PATENT DOCUMENTS

JP    H02-284449    11/1990

* cited by examiner

*Primary Examiner* — Joel Fosselman
(74) *Attorney, Agent, or Firm* — Fitzpatrick Cella, Harper & Scinto

(57) ABSTRACT

A scanning circuit, comprising first signal lines, second signal lines, third signal lines, a drive unit configured to drive the first signal lines, first buffers configured to drive the second signal lines in accordance with signals of the first signal lines, second buffers configured to drive the third signal lines in accordance with the signals of the first signal lines, and a shift register having a first part to be driven by signals of the second signal lines and a second part to be driven by signals of the third signal lines, wherein the first to third signal lines include two signal lines arranged in parallel to each other and configured to transmit the in-phase signals.

7 Claims, 7 Drawing Sheets

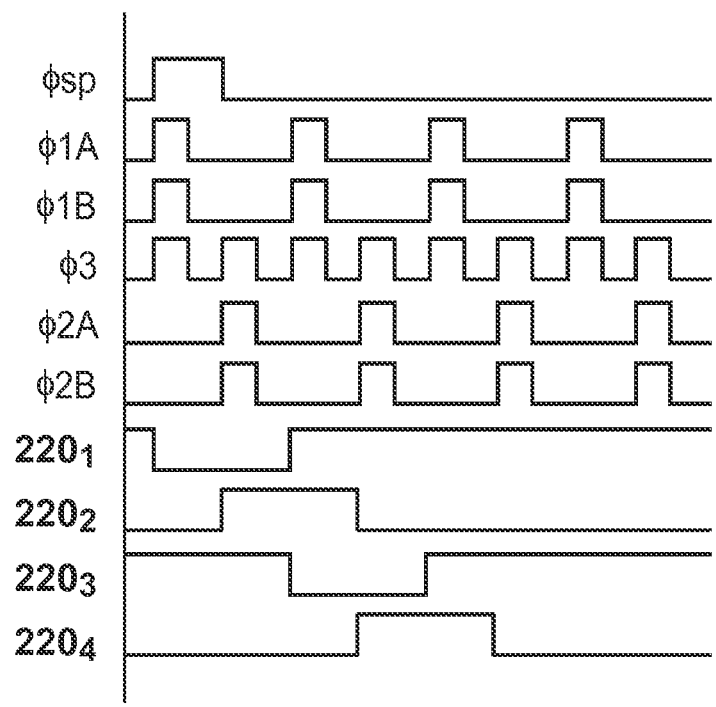

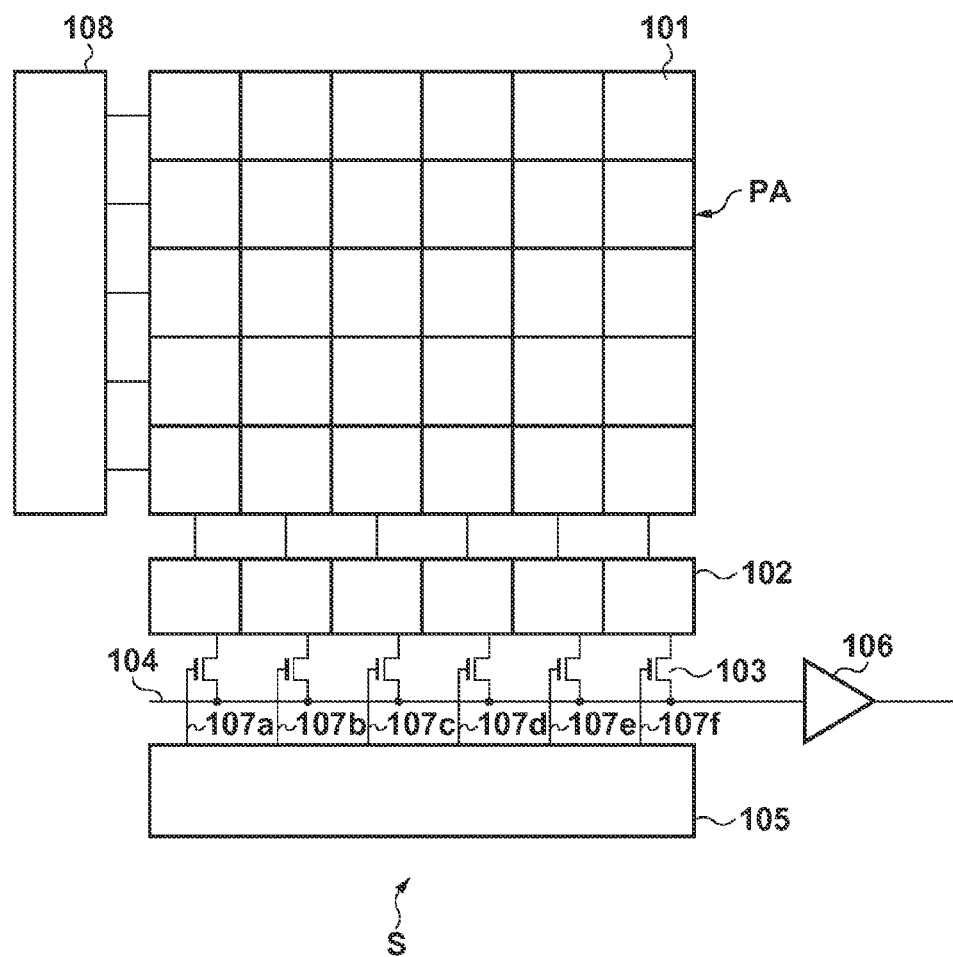
F I G. 6

SCANNING CIRCUIT, SOLID-STATE IMAGE SENSOR, AND CAMERA

BACKGROUND OF THE INVENTION

1. Field of the Invention

The present invention relates to a scanning circuit, a solid-state image sensor, and a camera.

2. Description of the Related Art

A solid-state image sensor can include a scanning circuit including a shift register to read out the pixel signal of each pixel in a pixel array. The scanning circuit is provided with a plurality of signal lines. The shift register can be driven by a plurality of first signal lines to transmit in-phase signals and a plurality of second signal lines to transmit opposite-phase signals. Such an arrangement including a plurality of signal lines needs to be designed in consideration of the capacitive coupling or crosstalk between the signal lines.

Japanese Patent Laid-Open No. 2-284449 discloses a wiring pattern of a bus line semiconductor memory device in which the distance between a plurality of first signal lines and a plurality of second signal lines is larger than that between the plurality of first signal lines (or between the second signal lines). According to this structure, capacitive coupling is suppressed between the signal lines that transmit in-phase signals, and crosstalk is suppressed between the signal lines that transmit opposite-phase signals. Hence, the above-described structure can effectively be applied to the wiring pattern of signal lines of a scanning circuit.

However, since this reduces the time difference in the timing to drive buffers provided on the respective signal lines, a voltage drop may occur due to an increase in the total amount of instantaneously generated through currents. This can be a more serious problem as the number of buffers increases.

SUMMARY OF THE INVENTION

The present invention provides a technique advantageous in stabilizing the operation of a scanning circuit including a plurality of signal lines.

One of the aspects of the present invention provides a scanning circuit, comprising a predetermined number of first signal lines, second signal lines in the predetermined number, third signal lines in the predetermined number, a drive unit configured to drive the predetermined number of first signal lines, the predetermined number of first buffers configured to drive the predetermined number of second signal lines in accordance with signals of the predetermined number of first signal lines, the predetermined number of second buffers configured to drive the predetermined number of third signal lines in accordance with the signals of the predetermined number of first signal lines, and a shift register having a first part to be driven by signals of the predetermined number of second signal lines and a second part to be driven by signals of the predetermined number of third signal lines, wherein the predetermined number of first signal lines include at least two signal lines arranged in parallel to each other and configured to transmit in-phase signals, the predetermined number of second signal lines include at least two signal lines arranged in parallel to each other and configured to transmit the in-phase signals, and the predetermined number of third signal lines include at least two signal lines arranged in parallel to each other and configured to transmit the in-phase signals.

Further features of the present invention will become apparent from the following description of exemplary embodiments with reference to the attached drawings.

BRIEF DESCRIPTION OF DRAWINGS

FIGS. 3A and 3B are views for explaining an example of the arrangement of a scanning circuit according to another embodiment;

FIG. 6 is a block diagram for explaining an example of the arrangement of a solid-state image sensor.

DESCRIPTION OF THE EMBODIMENTS

Figure 1A:
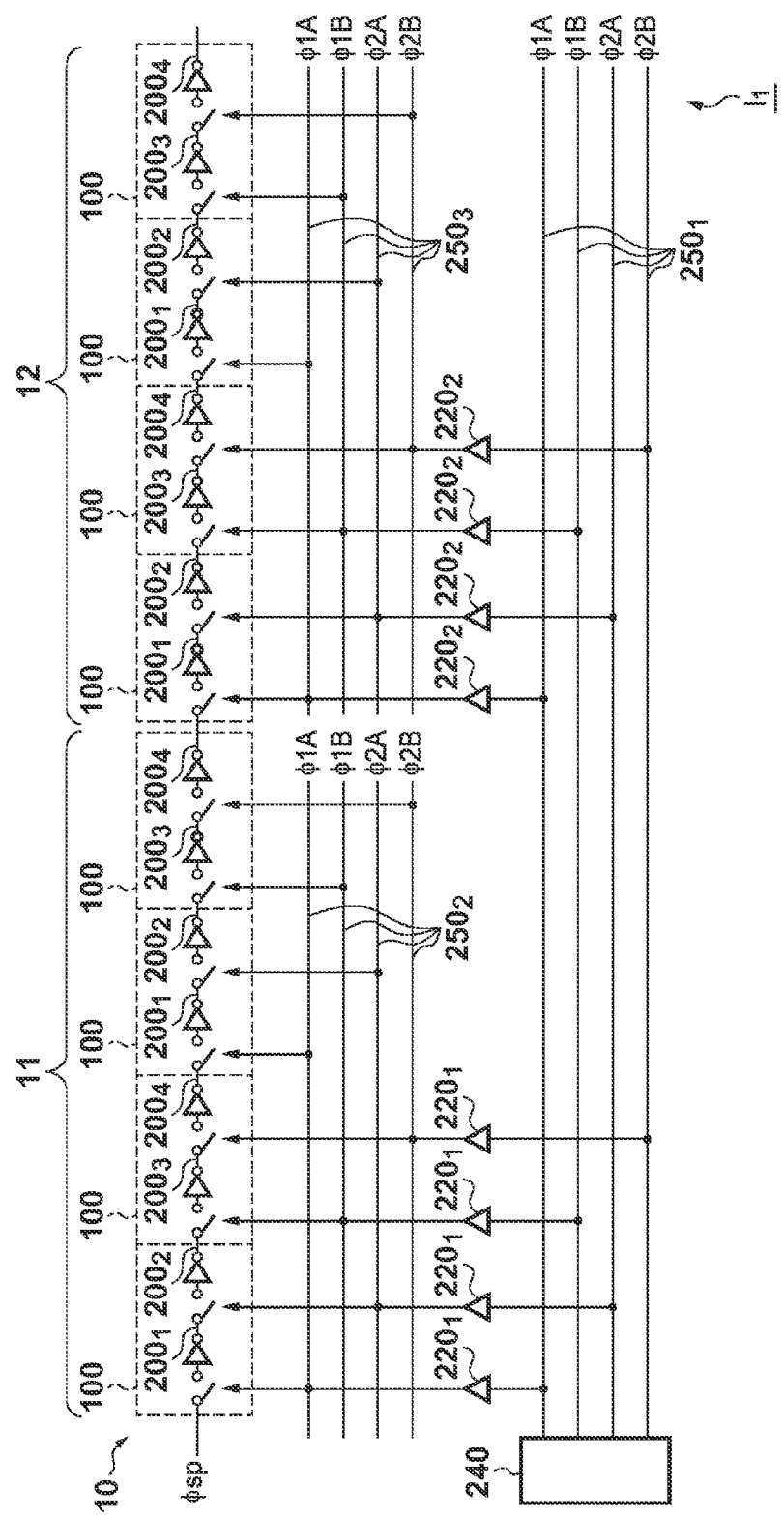
FIGS. 1A and 1B are circuit diagrams for explaining an example of the arrangement of a scanning circuit according to the first embodiment.

A scanning circuit $I_1$ according to each embodiment will be described with reference to FIGS. 1A to 5. The scanning circuit $I_1$ can include first signal lines $250_1$, second signal lines $250_2$, third signal lines $250_3$, a drive unit 240, first buffers $220_1$, second buffers $220_2$, and a shift register 10, as shown in FIG. 1A. In the arrangement illustrated here, the first signal lines $250_1$, the second signal lines $250_2$, the third signal lines $250_3$, the first buffers $220_1$, and the second buffers $220_2$ are provided as four-piece sets. However, the number is not limited to four, and they only need to be provided as sets of a predetermined number of pieces according to the specifications. The drive unit 240 drives each first signal line $250_1$. Each first buffer $220_1$ drives a corresponding second signal line $250_2$ in accordance with the signal on a corresponding first signal line $250_1$ (on the first signal line). Each second buffer $220_2$ drives a corresponding third signal line $250_3$ in accordance with the signal on a corresponding first signal line $250_1$.

The shift register 10 includes a first part 11 to be driven by the signal on each second signal line $250_2$ (on the second signal line), and a second part 12 to be driven by the signal on each third signal line $250_3$ (on the third signal line). Two of the four first signal lines $250_1$ are signal lines that transmit in-phase signals φ1A and φ1B (φ1x) and are arranged in parallel to each other. The remaining two of the four first signal lines $250_1$ are signal lines that transmit opposite-phase signals φ2A and φ2B (φ2x) with respect to the signals φ1x and are arranged in parallel to each other. In the arrangement illustrated here, the signal lines of the signals φ1x and φ2x are arranged in sets of two. However, sets of at least two signal lines suffice. For example, sets of four signal lines, that is, a total of eight signal lines may be arranged in accordance with the specifications. In the second signal lines $250_2$ and the third signal lines $250_3$ as well, the signal lines of the signals φ1x and φ2x are arranged in sets of two, like the first signal lines $250_1$. The first signal lines $250_1$, the second signal lines $250_2$, and the third signal lines $250_3$ will simply representatively be referred to as a "signal line 250" hereinafter. The first buffers $220_1$ and the second buffers $220_2$ will simply representatively be referred to as a "buffer 220" hereinafter.

Figure 1B:
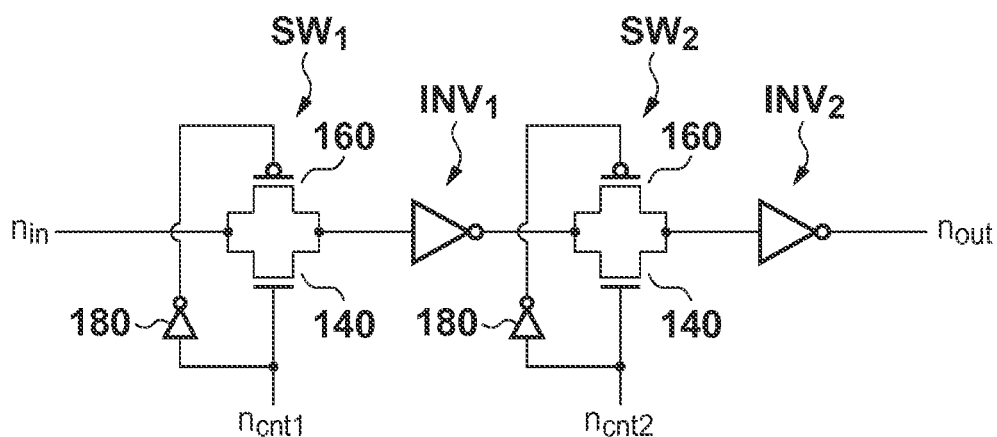

The shift register 10 can be formed by connecting a plurality of unit circuits 100 in series. As shown in FIG. 1B, each unit circuit 100 includes an input terminal $n_{in}$ that receives a pulse signal, an output terminal $n_{Out}$ that outputs a pulse signal, and control terminals $n_{cnt}$. Each unit circuit 100 includes a first inverter $INV_1$, a second inverter $INV_2$, a first switch $SW_1$, and a second switch $SW_2$. The first switch $SW_1$ is arranged between the input terminal $n_{in}$ of the unit circuit 100 and the input terminal of the first inverter $INV_1$. The second switch $SW_2$ is arranged between the output terminal of the first inverter $INV_1$ and the input terminal of the second inverter $INV_2$. The control terminals $n_{cnt}$ include a first control terminal $n_{cnt1}$ configured to control the first switch $SW_1$ and a second control terminal $n_{cnt2}$ configured to control the second switch $SW_2$. For example, an analog switch formed by arranging an NMOS transistor 140 and a PMOS transistor 160 in parallel is used as each of the first switch $SW_1$ and the second switch $SW_2$ (to representatively be referred to as a "switch SW" hereinafter). A signal input to the control terminal $n_{cnt}$ is input to the gate of the PMOS transistor 160 via an inverter 180. Hence, the NMOS transistor 140 and the PMOS transistor 160 simultaneously switch their states (conductive state or non-conductive state).

Figure 2:
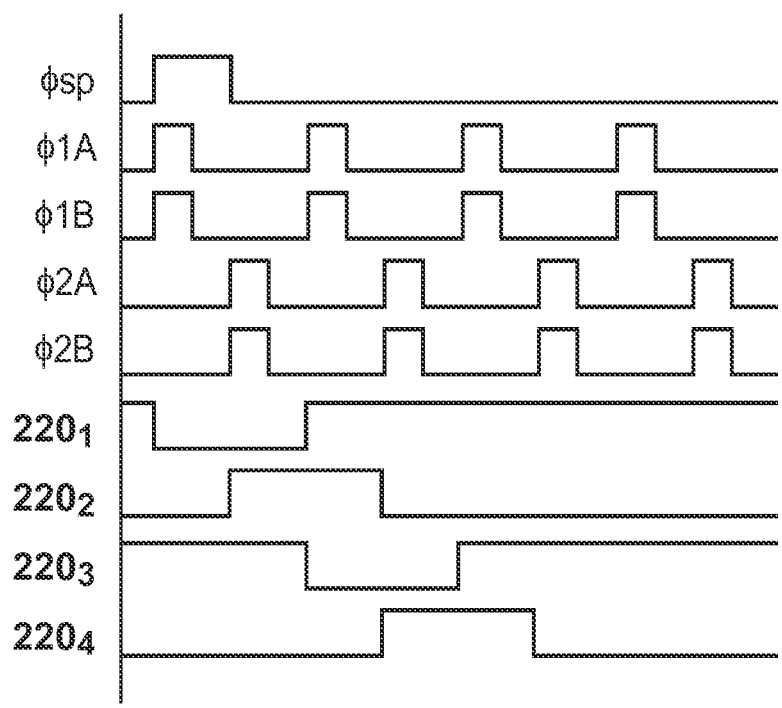
FIG. 2 is a view for explaining an example of the timing chart of the scanning circuit according to the first embodiment.

FIG. 2 is a timing chart of the scanning circuit $I_1$. First, a start pulse φsp is input to the scanning circuit $I_1$. As described above, the signals φ1A and φ1B are in phase and transit from Hi level to Low level or from Low level to Hi level at the same timing. The signals φ1A and φ1B and the signals φ2A and φ2B are in opposite phases. Each first switch $SW_1$ is set in the conductive state when the signals φ1A and φ1B are at Hi level and in the non-conductive state at Low level. Each second switch $SW_2$ is set in the conductive state when the signals φ2A and φ2B are at Hi level and in the non-conductive state at Low level. Hence, for example, the potential levels of nodes $200_1$, $200_2$, $200_3$, and $200_4$ change to sequentially shift and transmit a pulse in response to the start pulse φsp, as shown in FIG. 2.

As described above, the signal lines to transmit the signals φ1A and φ1B can be arranged in parallel to each other, and the signal lines to transmit the signals φ2A and φ2B can be arranged in parallel to each other. For example, neither charging nor discharging occurs in a parasitic capacitance (capacitance between wires) generated between the signal line of the signal φ1A and the signal line of the signal φ1B because the signals φ1A and φ1B are in phase. This can prevent rounding of the waveform of the signal to be transmitted and is therefore advantageous in terms of response property and the like, as compared to a case in which the signals are not in phase. This also applies to the signal line of the signal φ2A and the signal line of the signal φ2B. Each signal is input to a corresponding buffer 220. For the above-described reason, the time difference between the timings becomes small. If the number of buffers 220 to be driven at once is large, the total amount of through currents is large. This can lead to an instantaneous increase in power consumption and thus to a voltage drop and an operation error caused by the variation in the signal level.

The signal on each second signal line $250_2$ drives the first part 11 of the shift register 10. The signal on each third signal line $250_3$ drives the second part 12 of the shift register 10. Each of the first part 11 and the second part 12 is configured such that one buffer 220 is provided for at least two unit circuits 100. Since this arrangement decreases the number of buffers 220 to be driven at once as compared to a case in which one buffer 220 is provided for each unit circuit 100, the operation of the scanning circuit $I_1$ stabilizes.

Referring to FIG. 1A, the distance between the wiring pattern of the signal line of the signal φ1B and that of the signal line of the signal φ2A is preferably made larger than the distance between the wiring pattern of the signal line of the signal φ1A (or φ2A) and that of the signal line of the signal φ1B (or φ2B). As described above, neither charging nor discharging occurs in the parasitic capacitance generated between the signal line of the signal φ1A and the signal line of the signal φ1B because the signals φ1A and φ1B are in phase. This also applies to the signal line of the signal φ2A and the signal line of the signal φ2B. In FIG. 1A, however, since the signals φ1B and φ2A are in phases opposite to each other, charging or discharging occurs in the parasitic capacitance generated between the signal line of the signal φ1B and the signal line of the signal φ2A which are adjacent to each other. This can lead to rounding of the waveform to the signal to propagate. More specifically, the time necessary for transition from Low level to Hi level at the rise edge and the time necessary for transition from Hi level to Low level at the fall edge can delay. The influence of the parasitic capacitance can be reduced by arranging the wiring pattern of each signal line as described above.

Figure 3A:
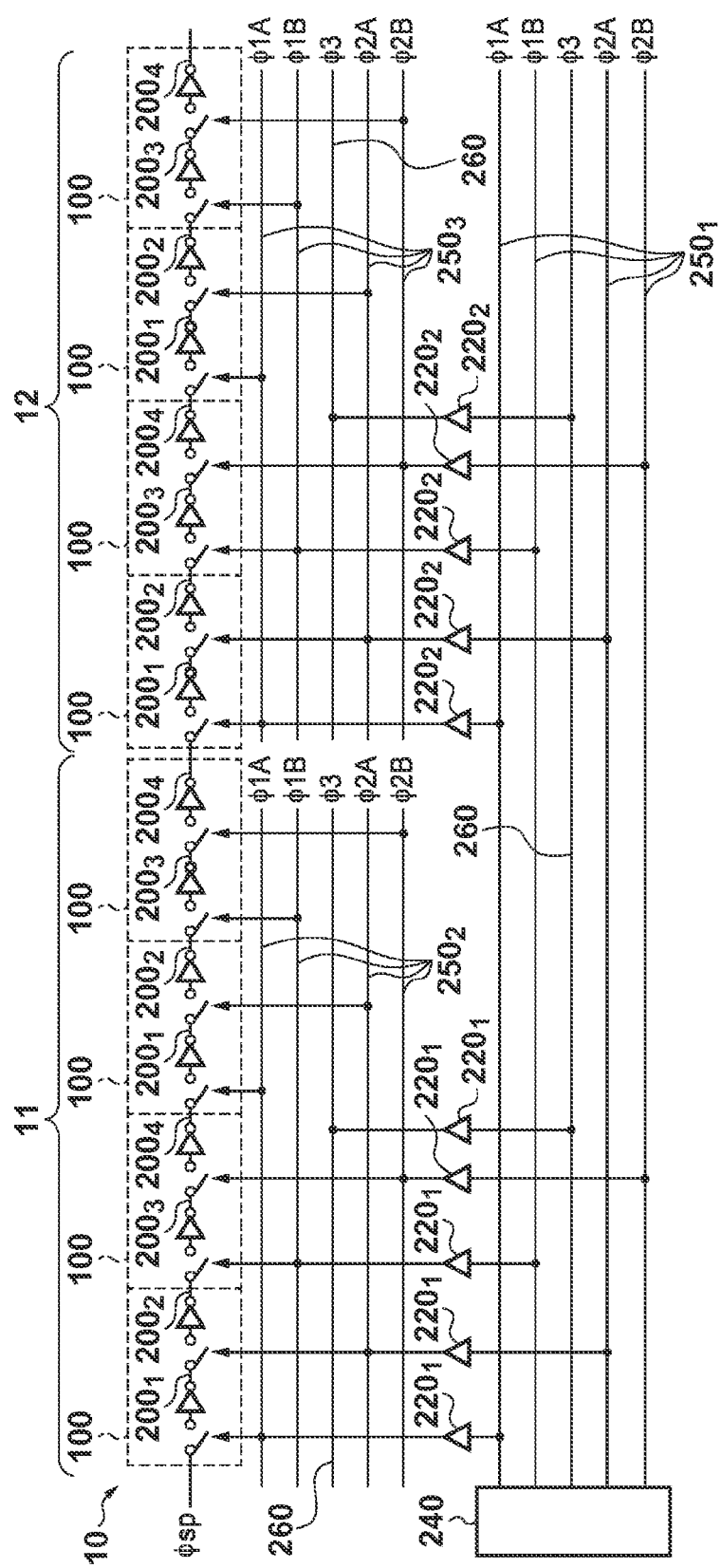

The scanning circuit $I_1$ may further include a signal line 260 (fourth signal line) to transmit a signal φ3, as shown in FIG. 3A. The signal φ3 has a frequency twice the frequency of the signal φ1A, φ1B, φ2A, or φ2B, as shown in FIG. 3B. The rise edge of the signal φ3 synchronizes with the rise edge of at least one of the pair of signals φ1A and φ1B and the pair of signals φ2A and φ2B. The fall edge of the signal φ3 synchronizes with the fall edge of at least one of the pair of signals φ1A and φ1B and the pair of signals φ2A and φ2B. The wiring pattern of the signal line to transmit the signal φ3 is preferably arranged between the wiring pattern of the signal line of the signal φ1B and the wiring pattern of the signal line of the signal φ2A in the first to third signal lines. With this arrangement, the same effect as described above can be expected because neither charging nor discharging occurs in the parasitic capacitance when the signal level transits at the rise edge and the fall edge.

Figure 4:
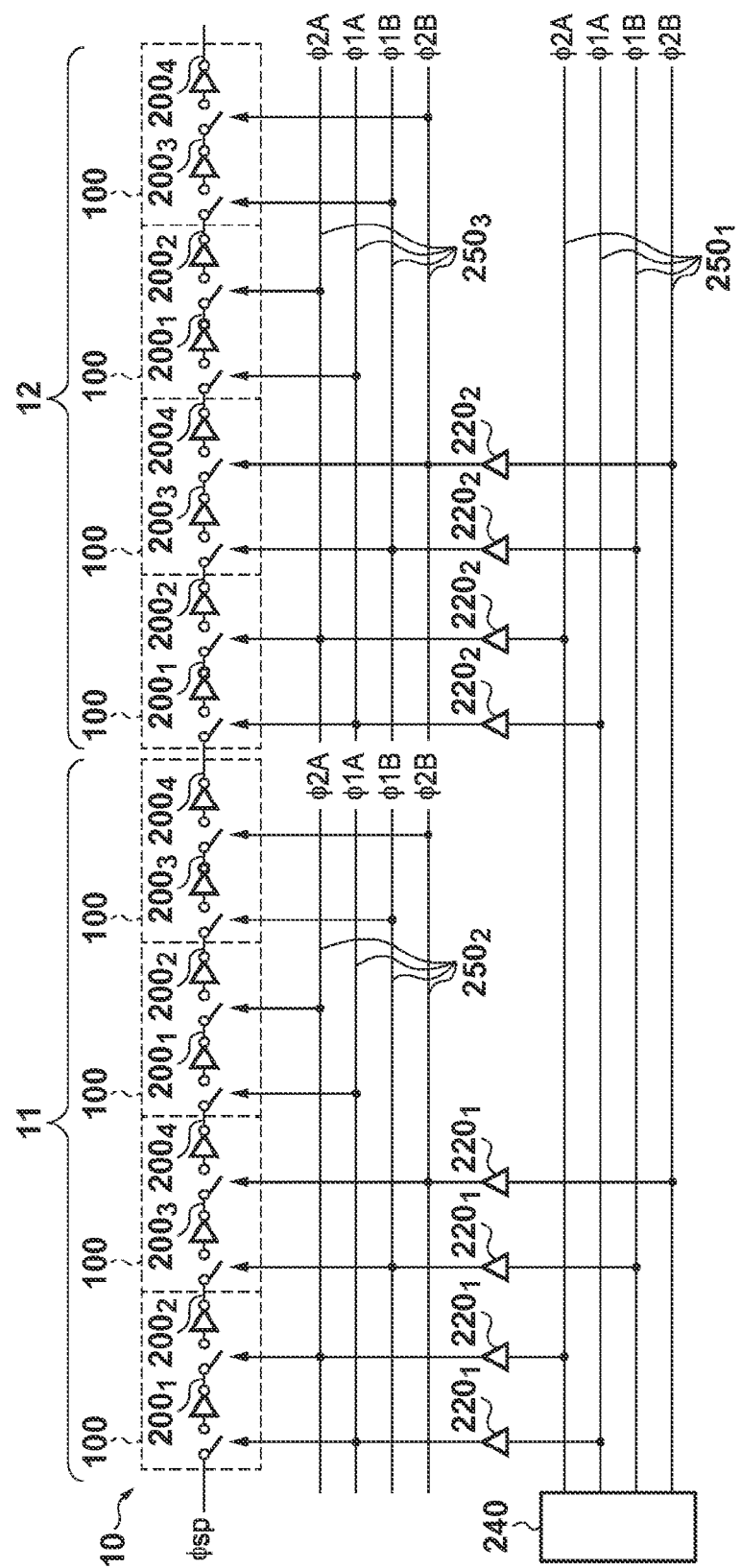
FIG. 4 is a circuit diagram for explaining an example of the arrangement of a scanning circuit according to still another embodiment.
Figure 5:
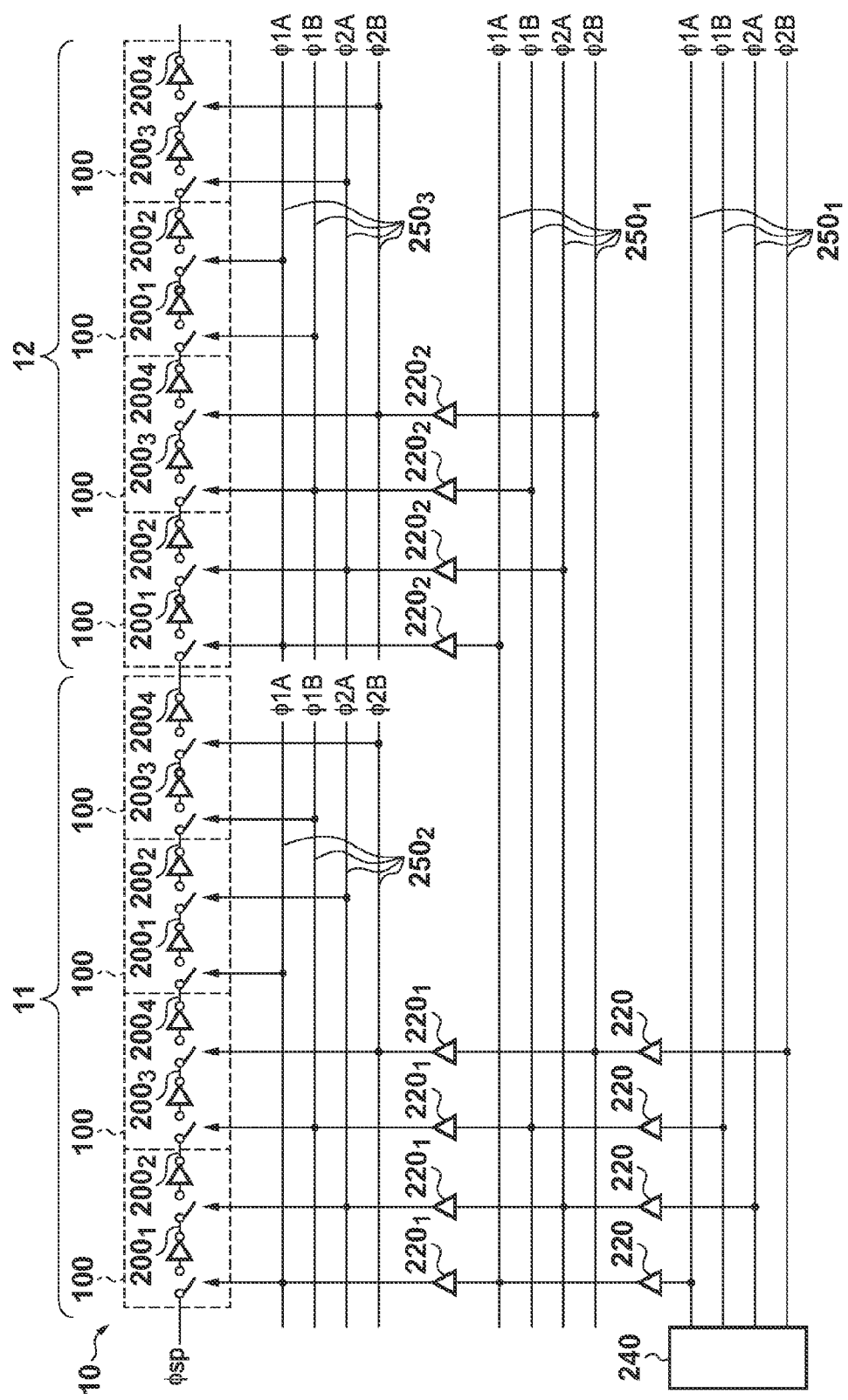
FIG. 5 is a circuit diagram for explaining an example of the arrangement of a scanning circuit according to still another embodiment.

The embodiment has been described above. However, the present invention is not limited to this embodiment. The present invention can appropriately be changed in accordance with the object, state, purpose, function, and other specifications and can also be implemented by other embodiments. In the above-described arrangement, for example, the shift register 10 includes unit circuits each formed from analog switches and inverters. However, the present invention is not limited to this, and any other known arrangement can be employed. Additionally, in the above-described arrangement, for example, each buffer 220 drives two unit circuits 100. However, the present invention is not limited to this, and each buffer may drive three or more unit circuits. Furthermore, in the above-described arrangement, for example, the signal lines to transmit the signals φ1x are arranged in parallel to each other, and the signal lines to transmit the signals φ2x are arranged in parallel to each other. However, the present invention is also applicable to an arrangement in which one of the signal line pairs is arranged between the signal lines of the other, as shown in FIG. 4. For example, the signal line arrangement in the first to third signal lines is not limited to this. For example, signal lines of phases different from each other may be arranged in wiring layers different from each other. In the above-described arrangement, for example, one stage of buffer 220 is arranged between the drive unit 240 and each unit circuit 100. However, a plurality of stages of buffers 220 may be provided, as shown in FIG. 5, without departing from the scope of the present invention.

(Example of Application to Solid-State Image Sensor)

A solid-state image sensor S according to an embodiment of the present invention will be described with reference to FIG. 6. The solid-state image sensor S includes a pixel array PA, a vertical scanning circuit 108, and a horizontal scanning circuit 105. The pixel array PA is formed by arraying a plurality of pixels 101 so as to form a plurality of rows and a plurality of columns. The vertical scanning circuit 108 can include the scanning circuit $I_1$ that selects a row to read signals out of the plurality of rows of the pixel array PA. The horizontal scanning circuit 105 can include the scanning circuit $I_1$ that selects a column to read signals out of the plurality of columns of the pixel array PA. The solid-state image sensor S can further include a plurality of column read circuits 102, a plurality of column selection switches 103, a common output line 104, and an amplification circuit 106. Each column read circuit 102 reads a signal, via a column signal line, from the pixel 101 of a corresponding column in the row selected by the vertical scanning circuit 108 out of the plurality of rows of the pixel array PA. Each column selection switch 103 is turned on when the logic level of a corresponding one of selection signals 107 (107a to 107f) output from the horizontal scanning circuit 105 changes to the active level, thereby connecting the corresponding column read circuit to the common output line 104. The amplification circuit 106 amplifies the signal transmitted to the common output line 104 and outputs it.

When the scanning circuit $I_1$ is provided to the horizontal scanning circuit 105, for example, the output signal of the scanning circuit can be supplied to the column selection switch 103. When the scanning circuit $I_1$ is applied to the vertical scanning circuit 108, for example, a transfer signal, a reset signal, and a row selection signal can be generated based on the output signal of the scanning circuit $I_1$ and supplied to the pixels of each row. Each pixel can include, for example, a photoelectric conversion element, a floating diffusion, a transfer transistor, an amplification transistor, a reset transistor, and a row selection transistor. The transfer transistor transfers charges accumulated in the photoelectric conversion element to the floating diffusion in accordance with the transfer signal. The amplification transistor outputs a signal corresponding to the potential of the floating diffusion to the column signal line. The reset transistor resets the potential of the floating diffusion in accordance with the reset signal. The row selection transistor becomes active in accordance with the row selection signal and thus causes the amplification transistor to drive the column signal line.

The operation mode of the solid-state image sensor S will be described by exemplifying the case in which the scanning circuit $I_1$ is applied to the horizontal scanning circuit 105. The solid-state image sensor S can include a first mode and a second mode as the operation modes. The first mode can be a mode to output the signals of a plurality of pixels from the solid-state image sensor S, for example, a mode to output the signals of all pixels of the pixel array PA from the solid-state image sensor S. Hence, the first mode is a so-called progressive scanning mode.

On the other hand, the second mode can be a mode to output one signal in correspondence with a plurality of pixels from the solid-state image sensor S, for example, a mode to obtain, from the signals of a plurality of pixels, each signal to be output from the solid-state image sensor S. To obtain, from the signals of a plurality of pixels, each signal to be output from the solid-state image sensor S, for example, the signals of a plurality of pixels are synthesized (for example, addition or averaging), or one of the signals of a plurality of pixels is selected (that is, other pixels are thinned out). Hence, the second mode is a so-called reduction mode. The second mode includes, for example, a ½ reduction mode to obtain, from the signals of two pixels, each signal to be output from the solid-state image sensor S.

The plurality of unit circuits 100 included in the shift register 10 are put into, for example, two groups (first group and second group). In the first mode, the drive unit 240 supplies clock signals to the control terminals $n_{cnt}$ of the unit circuits 100 of each group. That is, the signals $\phi 1x$ and $\phi 2x$ that are clock signals in phases opposite to each other are input to the corresponding control terminals $n_{cnt}$, respectively. In accordance with the clock signals, each unit circuit 100 operates to sequentially shift the input pulse signal.

On the other hand, in the second mode, the drive unit supplies, to the control terminals $n_{cnt}$ of the unit circuits 100 of one (for example, first group) of the two groups, a logic level to cause each unit circuit 100 of the first group to operate as a buffer. More specifically, the drive unit 240 outputs Hi level in place of the signals $\phi 1A$ and $\phi 1B$. The drive unit supplies clock signals to the control terminals $n_{cnt}$ of the unit circuits 100 of the other group (for example, second group). That is, the drive unit 240 outputs the signals $\phi 2A$ and $\phi 2B$. Each unit circuit 100 of the second group thus transfers the pulse signal output from the output terminal $n_{out}$ of the unit circuit 100 of the preceding stage to the input terminal $n_{in}$ of the unit circuit 100 of the subsequent stage in accordance with the clock signals. In this way, each unit circuit 100 of the first group and the unit circuit 100 of the preceding stage are caused to output the pulse signal, thereby executing the ½ reduction mode here.

The second mode can also include a reduction mode of ⅓ or less to obtain, from the signals of three or more pixels, each signal to be output from the solid-state image sensor S. Each reduction mode can be implemented by, for example, causing each signal line 250 to have a number of signal lines corresponding to the variation of the reduction mode and performing control to make the drive unit 240 output a signal level corresponding to the reduction mode.

The solid-state image sensor included in a camera has been described above. The concept of the camera includes not only an apparatus mainly aiming at image capturing but also an apparatus (for example, a personal computer or a portable terminal) secondarily having an image capturing function. The camera can include the solid-state image sensor according to the present invention described in the above embodiment, and a processor that processes a signal output from the solid-state image sensor. This processor can include, for example, an A/D converter and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-203536, filed Sep. 14, 2012, which is hereby incorporated by reference herein in its entirety.

What is claimed is:

1. A scanning circuit comprising:
   a predetermined number of first signal lines;
   second signal lines in the predetermined number;
   third signal lines in the predetermined number;
   a drive unit configured to drive the predetermined number of first signal lines;
   first buffers in the predetermined number, configured to drive the predetermined number of second signal lines in accordance with signals of the predetermined number of first signal lines;
   second buffers in the predetermined number, configured to drive the predetermined number of third signal lines in accordance with the signals of the predetermined number of first signal lines; and
   a shift register having a first part to be driven by signals of the predetermined number of second signal lines and a second part to be driven by signals of the predetermined number of third signal lines, wherein the predetermined number of first signal lines include at least two signal lines arranged in parallel to each other and configured to transmit in-phase signals, the predetermined number of second signal lines include at least two signal lines arranged in parallel to each other and configured to transmit the in-phase signals, and the predetermined number of third signal lines include at least two signal lines arranged in parallel to each other and configured to transmit the in-phase signals.

2. The circuit according to claim 1, wherein the predetermined number of first signal lines further include at least two signal lines arranged in parallel to each other and configured to transmit opposite-phase signals with respect to the in-phase signals, the predetermined number of second signal lines further include at least two signal lines arranged in parallel to each other and configured to transmit the opposite-phase signals, and the predetermined number of third signal lines further include at least two signal lines arranged in parallel to each other and configured to transmit the opposite-phase signals.

3. The circuit according to claim 1, further comprising a fourth signal line configured to transmit a signal having a frequency twice a frequency of the in-phase signals and the opposite-phase signals, wherein the fourth signal line is arranged between the at least two signal lines configured to transmit the in-phase signals in the first signal lines and the at least two signal lines configured to transmit the in-phase signals in the second signal lines, and between the at least two signal lines configured to transmit the opposite-phase signals in the first signal lines and the at least two signal lines configured to transmit the opposite-phase signals in the second signal lines, a rise edge of the signal transmitted through the fourth signal line synchronizes with a rise edge of at least one of the in-phase signal and the opposite-phase signal, and a fall edge of the signal transmitted through the fourth signal line synchronizes with a fall edge of at least one of the in-phase signal and the opposite-phase signal.

4. The circuit according to claim 1, wherein the shift register is formed by connecting a plurality of unit circuits in series, each of the plurality of unit circuits comprising an input terminal configured to receive a pulse signal, an output terminal configured to output a pulse signal, and a control terminal, the plurality of unit circuits are put into a plurality of groups, and the drive unit, in a first mode, supplies a clock signal to the control terminal of each unit circuit of the plurality of groups, thereby operating the plurality of unit circuits to shift a pulse signal in accordance with the clock signal, and the drive unit, in a second mode, supplies, to the control terminal of each unit circuit of at least one group of the plurality of groups, a logic level to operate the unit circuit of the at least one group as a buffer, and supplies the clock signal to the control terminal of each unit circuit of remaining groups of the plurality of groups, thereby operating each unit circuit of the remaining groups to transfer a pulse signal output from the output terminal of the unit circuit of a preceding stage to the input terminal of the unit circuit of a subsequent stage in accordance with the clock signal and thus causing each unit circuit of the at least one group and the unit circuit of the preceding stage to output a pulse signal in one period.

5. The circuit according to claim 1, wherein each of the plurality of unit circuits comprises a first inverter, a second inverter, a first switch arranged between the input terminal of the unit circuit and the input terminal of the first inverter, and a second switch arranged between the output terminal of the first inverter and the input terminal of the second inverter, and the control terminal comprises a first control terminal configured to control the first switch and a second control terminal configured to control the second switch.

6. A solid-state image sensor comprising:

a pixel array in which a plurality of pixels are arrayed so as to form a plurality of rows and a plurality of columns;

a vertical scanning circuit configured to select a row to read a signal out of the plurality of rows; and a horizontal scanning circuit configured to select a column to read a signal out of the plurality of columns, wherein at least one of the vertical scanning circuit and the horizontal scanning circuit includes a scanning circuit, wherein the scanning circuit comprises:

a predetermined number of first signal lines;
second signal lines in the predetermined number;
third signal lines in the predetermined number;
a drive unit configured to drive the predetermined number of first signal lines;
first buffers in the predetermined number, configured to drive the predetermined number of second signal lines in accordance with signals of the predetermined number of first signal lines;
second buffers in the predetermined number, configured to drive the predetermined number of third signal lines in accordance with the signals of the predetermined number of first signal lines; and
a shift register having a first part to be driven by signals of the predetermined number of second signal lines and a second part to be driven by signals of the predetermined number of third signal lines, wherein the predetermined number of first signal lines include at least two signal lines arranged in parallel to each other and configured to transmit in-phase signals, the predetermined number of second signal lines include at least two signal lines arranged in parallel to each other and configured to transmit the in-phase signals, and the predetermined number of third signal lines include at least two signal lines arranged in parallel to each other and configured to transmit the in-phase signals.

7. A camera comprising:

a solid-state image sensor of claim 6; and a processor configured to process a signal output from the solid-state image sensor, wherein the solid-state image sensor comprises:

a pixel array in which a plurality of pixels are arrayed so as to form a plurality of rows and a plurality of columns;

a vertical scanning circuit configured to select a row to read a signal out of the plurality of rows; and a horizontal scanning circuit configured to select a column to read a signal out of the plurality of columns, wherein at least one of the vertical scanning circuit and the horizontal scanning circuit includes a scanning circuit, wherein the scanning circuit comprises:

a predetermined number of first signal lines;
second signal lines in the predetermined number;
third signal lines in the predetermined number;

a drive unit configured to drive the predetermined number of first signal lines:

first buffers in the predetermined number, configured to drive the predetermined number of second signal lines in accordance with signals of the predetermined number of first signal lines;

second buffers in the predetermined number, configured to drive the predetermined number of third signal lines in accordance with the signals of the predetermined number of first signal lines; and a shift register having a first part to be driven by signals of the predetermined number of second signal lines and a second part to be driven by signals of the predetermined number of third signal lines, wherein the predetermined number of first signal lines include at least two signal lines arranged in parallel to each other and configured to transmit in-phase signals, the predetermined number of second signal lines include at least two signal lines arranged in parallel to each other and configured to transmit the in-phase signals, and the predetermined number of third signal lines include at least two signal lines arranged in parallel to each other and configured to transmit the in-phase signals.

* * * * *